(12) United States Patent
Asano et al.

(10) Patent No.: US 7,179,693 B2
(45) Date of Patent: Feb. 20, 2007

(54) METHOD FOR MANUFACTURING THIN FILM DEVICE THAT INCLUDES A CHEMICAL ETCHANT PROCESS

(75) Inventors: Akihiko Asano, Kanagawa (JP); Tomoatsu Kinoshita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/079,049

(22) Filed: Mar. 14, 2005

(65) Prior Publication Data

US 2005/0181547 A1    Aug. 18, 2005

Related U.S. Application Data

(63) Continuation of application No. 10/311,192, filed as application No. PCT/JP02/03700 on Apr. 12, 2002, now Pat. No. 6,916,681.

(30) Foreign Application Priority Data

Apr. 13, 2001    (JP)    ............................ P2001-115119

(51) Int. Cl.
    *H01L 21/00*    (2006.01)
(52) U.S. Cl. ...................... 438/149; 438/118; 438/747; 257/E21.411; 257/E21.499
(58) Field of Classification Search ................ 438/149, 438/106, 118, 747; 257/E21.411, E21.499
    See application file for complete search history.

(56) References Cited

U.S. PATENT DOCUMENTS 5,339,180 A    8/1994    Katoh

| | | | |
|---|---|---|---|
| 6,208,400 B1 * | 3/2001 | Kameyama et al. | 349/147 |
| 6,682,990 B1 * | 1/2004 | Iwane et al. | 438/458 |
| 6,700,631 B1 * | 3/2004 | Inoue et al. | 349/45 |
| 2005/0162578 A1 * | 7/2005 | Yamazaki et al. | 349/42 |

FOREIGN PATENT DOCUMENTS

| | | |
|---|---|---|
| EP | 1 014 452 | 6/2000 |
| JP | 05-226312 | 9/1993 |
| JP | 06-118441 | 4/1994 |
| JP | 06-504139 | 5/1994 |
| JP | 09-116158 | 5/1997 |
| JP | 11-212116 | 8/1999 |
| JP | 11-312811 | 11/1999 |
| WO | WO 92/12453 | 7/1992 |
| WO | WO 99/44242 | 9/1999 |

* cited by examiner

*Primary Examiner*—Michael Lebentritt
*Assistant Examiner*—Stanetta Isaac
(74) *Attorney, Agent, or Firm*—Sonnenschein Nath & Rosenthal LLP

(57) ABSTRACT

The present invention relates to a method for manufacturing a thin film device. The thin film device is manufactured by bonding a second substrate (106) to a thin film device layer (103) provided on a protective layer (102) formed on a first substrate (101) through a first adhesive layer (105), then, completely or partly removing the first substrate (101) in accordance with a process including at least one process of a chemical process and a mechanical polishing process, bonding a third substrate (109) to the exposed protective layer (102) or the protective layer (102) covered with the partly removed first substrate (101) through a second adhesive layer (108) and separating or removing the second substrate (106). Thus, the thin film device suitable for a light and thin display panel is manufactured without deteriorating a ruggedness.

4 Claims, 15 Drawing Sheets

METHOD FOR MANUFACTURING THIN FILM DEVICE THAT INCLUDES A CHEMICAL ETCHANT PROCESS

RELATED APPLICATION DATA

The is a continuation of U.S. application Ser. No. 10/311,192 filed Dec. 13, 2002 now U.S. Pat. No. 6,916,681 which claims priority to Japanese Application No. P2001-115119 filed Apr. 13, 2001 and is a 371 of PCT/JP02/03700 filed Apr. 12, 2002, all of which are incorporated herein by reference to the extent permitted by law.

TECHNICAL FIELD

The present invention relates to a method for manufacturing a thin film device and a semiconductor device, and more particularly, to a method for manufacturing a thin film device used for a flat type display panel employing a liquid crystal or an electroluminescence (abbreviated it as an EL, hereinafter) or the like and forming an active matrix type driving substrate using, for instance, a thin film transistor (Thin Film Transistor, refer it to as a TFT, hereinafter) and a semiconductor device using a non-glass substrate, that is, a plastic substrate, a ceramic substrate or a metal substrate and employed for a display panel.

BACKGROUND ART

In recent years, the thin film device constituting a liquid crystal display panel or an EL display panel or the like used for a portable telephone or a portable information terminal such as a PDA has been increasingly requested to be rugged, thin and light. For example, in the liquid crystal display panel, in order to meet these demands, there has been partly used a technology that a counter substrate is bonded to a driving substrate and then the glass substrate is thinned by a mechanical polishing or a chemical etching process as well as a process that the glass substrate is initially thinned.

However, since the thin film device is manufactured under an environment of vacuum and high temperature, a substrate used for manufacture has a limitation. For instance, in a liquid crystal display device using the thin film transistor (TFT), a quartz substrate capable of enduring the temperature of 1000° C. and a glass substrate capable of enduring the temperature of 500° C. are employed. Although a method for thinning these substrates is studied, as long as the quartz substrate and the glass substrate are used, the size of the substrate needs to be reduced to prevent the rigidity of the substrate from being deteriorated, a productivity is lowered. Further, since the processing time of a glass thinning process is increased, the practical thickness of a driving substrate forming a display panel cannot be inconveniently reduced to 0.3 to 0.4 mm or smaller. Further, when the thickness of the glass substrate is reduced, a deflection is increased inversely proportionally to the cube of the thickness of the glass substrate. Thus, when the glass substrate is applied to a portable information terminal, an important ruggedness is abruptly deteriorated, which results in a factor for restriction not lower than the productivity. As described above, a performance required for a produced substrate is different from a performance required when it is actually used.

Therefore, it has been requested to use a thin and light plastic substrate in place of the glass substrate serving as a base of the thin film transistor substrate employed for the liquid crystal display panel or the like, however, the plastic substrate may be used with high difficulty in view of heat resisting temperature.

DISCLOSURE OF THE INVENTION

It is an object of the present invention to provide a method for manufacturing a thin film device suitable for a light and thin display panel without deteriorating a ruggedness and a semiconductor device.

For achieving the above-described object, according to the present invention, a second substrate is bonded to a thin film device layer provided on a protective layer formed on a first substrate through a first adhesive layer, then, the first substrate is completely or partly separated or removed in accordance with at least one process of a chemical process and a mechanical polishing process, a third substrate is bonded to the exposed protective layer or the protective layer covered with the partly separated or removed first substrate through a second adhesive layer, and then, the second substrate is separated or removed. According to the method for manufacturing a thin film device, since the temperature of the substrate when the thin film device layer is formed does not undergo a restriction of the heat resistant temperature of the third substrate, a plastic substrate whose heat resistant temperature is lower than that of a glass substrate can be used for the third substrate. On the other hand, when the thin film device layer is formed, a substrate whose heat resistant temperature is high such as a quartz substrate, a silicon substrate, a gallium arsenide substrate, etc. is employed, so that there is no fear that the performance or the reliability of a device may be lowered due to the fall of process temperature.

Still other objects of the present invention and specific advantages attained by the present invention will be more apparent from the description of embodiments by referring to the accompanying drawings.

BEST MODE FOR CARRYING OUT THE INVENTION

Figure 1A:
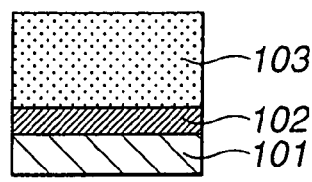
FIGS. 1A to 1I are sectional views showing the manufacturing processes of a thin film device according to a first embodiment of the present invention in order.

Now, a method for manufacturing a thin film device according to the present invention will be described by referring to embodiments.

A method for manufacturing a thin film device according to the present invention comprises:

(1) a step of bonding a second substrate to a thin film device layer provided on a protective layer formed on a first substrate through a first adhesive layer;

(2) a step of completely or partly separating or removing the first substrate in accordance with a step including at least one process of a chemical process and a mechanical polishing process;

(3) a step of bonding a third substrate to the exposed protective layer or the protective layer covered with the partly removed first substrate through a second adhesive layer; and (4) a step of separating or removing the second substrate.

Now, each step of the method for manufacturing a thin film device according to the present invention will be described below.

In the step (1), the second substrate is bonded to the thin film device layer provided on the protective layer formed on the first substrate through the first adhesive layer.

As the first substrate, there may be exemplified substrates made of glass, quartz, silicon, gallium arsenide, gallium phosphide, silicon carbide (SiC), sapphire, etc. A glass substrate low in its available cost is most preferable among them.

The protective layer functions as a stopper layer for the chemical process in the below-described step (2). As such a protective layer, layers having a resistance relative to chemical agents used for the chemical process are employed. For instance, when the first substrate is made of glass quartz and silicon, a chemical etching process using a chemical agent including hydrofluoric acid is preferable as the chemical process. Accordingly, as the protective layer, there may be preferably exemplified a layer made of metal having a resistance relative to hydrofluoric acid such as molybdenum (Mo), tungsten (W), stainless steel, inconel, amorphous Si, amorphous Si including hydrogen, polycrystalline Si, etc, a diamond thin film having a resistance relative to hydrofluoric acid, or a diamond-like carbon thin film. The thickness of the protective layer is ordinarily 0.1 μm to 5 μm. The protective layer can be properly determined depending on materials. For instance, the molybdenum thin film can be formed by a sputtering method or a vacuum deposition method.

The thin film device layer preferably includes at least one of a thin film transistor, a thin film diode, capacitor or resistor formed by, what is called a low temperature polysilicon process in which substrate temperature is 500° C. or lower or what is called an amorphous silicon process in which substrate temperature is 400° C. or lower.

As the first adhesive layer, a thermoplastic adhesive whose melting point is 200° C. or lower is preferably used. For example, there are enumerated thermoplastic ethylene-vinyl acetate elastomer, styrene-butadiene block copolymer, styrene-ethylene-butylene block copolymer, styrene-isoprene block copolymer, ethylene-vinyl chloride copolymer, acetate resin, polyvinyl chloride, polyethylene, polypropylene, polymethylpentene, polybutene, thermoplastic polybutadiene, polystyrene, polybutadiene, polyvinyl acetate, polymethyl methacrylate, polyvinylidene chloride, polyvinyl alcohol, polytetrafluoro ethylene, ethylene-tetrafluoro ethylene copolymer, acrylonitrile-styrene copolymer (AS resin), acrylonitrile-butadiene-styrene (ABS resin), ionomer, AAS resin, ACS resin, polyacetal, polycarbonate, polyphenylene ether, polyethylene terephthalate, polybutylene terephthalate, polyarylate, polysulfone, polyether sulfone, polyimide, polyamide, polyamide imide, polyphenylene sulfide, polyoxybenzoyl, polyether ether ketone, polyether imide, liquid crystal polyester, cellulose-based plastic (cellulose acetate, cellulose acetate butyrate, ethyl cellulose, celluloid cellophane), polyolefine, polyurethane and copolymers and polymer alloys of them, wax, paraffin, coal tar, rosin, natural rubber and fluoro rubber, etc.

The thickness of the first adhesive layer is 1 μm to 3000 μm. The first adhesive layer can be formed by an ordinary method such as a bar coater.

As the second substrate, there may be preferably exemplified a plate made of metal having an acid resistance such as molybdenum (Mo), tungsten (W), stainless steel, inconel (for instance, inconel 625 (having a composition of Ni>58%, Cr of 20% to 23%, Fe<5%, Mo of 8% to 10%, and Nb of 3.1% to 4.2%)) or a laminated plate composed of them, a metal plate, a glass plate or a ceramic plate covered with acid resistant metal films composed of them or a laminated plate composed of them. Otherwise, a plastic plate composed of polycarbonate, polyethylene terephthalate, polyether sulfone, polyolefine, polyimide, etc.

The second substrate can be stuck to the thin film device layer depending on the property of the employed first adhesive layer. For example, when the first adhesive layer is composed of a thermoplastic adhesive (hot melt adhesive), the second substrate can be stuck to the thin film device layer under a heating process by a hot plate.

A separate layer the chemical processing speed of which is higher than that of the first substrate can be provided between the first substrate and the protective layer. Such a separate layer is provided so that the separate layer is removed before the first substrate upon removing the first substrate by the chemical process in a below-described step (2). Consequently, the first substrate can be removed so as to lift off.

As such a separate layer when the first substrate is a glass substrate, there may be exemplified an $SiO_2$ layer formed by a plasma CVD method having low substrate temperature (150° C. or lower).

When one second substrate is bonded to thin film device layers provided on protective layers respectively formed on a plurality of first substrates through first adhesive layers, the different thin film device layers can be formed on one third substrate.

Subsequently, the step (2) is carried out. In other words, the first substrate is completely or partly removed by a process including at least one of the chemical process or the mechanical polishing process.

The chemical process can be determined depending on the material of the first substrate as described in the step (1). Further, as the mechanical polishing process, there may be preferably exemplified, what is called a chemical and mechanical polishing process (CMP).

Both the chemical process and the mechanical polishing process are preferably carried out. In that case, both the processes are carried out at the same time or the chemical process is preferably carried out after the mechanical polishing process.

The first substrate may be completely removed until the protective layer is exposed, or may be partly removed to an extent that a thin first substrate is slightly left. However, the first substrate is preferably completely removed until the protective layer is exposed.

In at least one process of the chemical process or the mechanical polishing process, a seal part for preventing the entry of processing liquid to the thin film device layer is preferably provided in the outer peripheral area of a bonded member in which the first substrate and the second substrate are bonded to the upper and lower parts of the thin film device layer.

The seal part can be formed of a material (for instance, a hot melt adhesive) having a resistance relative to the chemical process.

When the separate layer is provided between the first substrate and the protective layer, the chemical process of the separate layer can be preferably carried out by allowing a chemical agent to reach the separate layer through a through hole of the first substrate formed by a chemical process subsequent to a process for forming at least one of a hole mechanically opened on the first substrate or a hole opened by a chemical process from a resist opening part formed by a photolithography on a resist layer with which the first substrate is covered.

Then, the step (3) is carried out. In other words, the third substrate is bonded to the exposed protective layer or the protective layer covered with the partly removed first substrate through the second adhesive layer.

As the second adhesive layer, there may be preferably exemplified an epoxy-based adhesive or an ultraviolet curing adhesive.

As the third substrate, a base material having heat resistant temperature of 100° C. is preferable. Specifically, polyimide can be exemplified. In addition thereto, there may be employed a substrate composed of polyethylene terephthalate, polyethylene naphthalate, polybutylene terephthalate, polycarbonate, polyether sulfone, polyolefine, polypropylene, polybutylene, polyamide, polyamide imide, polyether ether ketone, polyether imide, polyether ketone, polyarylate, polysulfone, polyphenylene sulfide, polyphenylene ether, polyacetal, polymethylpentene, epoxy resin, diallyl phthalate resin, phenolic resin, unsaturated polyester resin, liquid crystal plastic, polybenzimidazole, thermosetting polybutadiene, etc., polymer alloys composed of these materials, a simple substance substrate reinforced by fibers, a simple substance substrate reinforced by a filler such as silica, a laminated substrate made of the same materials, or a laminated substrate including at least one of them, a simple substance substrate made of a metallic plate such as stainless steel, aluminum, etc, or a ceramics plate including as components, alumina ($Al_2O_3$), silica ($SiO_2$), silicon carbide (SiC), magnesium oxide (MgO), calcium oxide (CaO), etc or a laminated substrate including at least one of them. Especially, as the third substrate, the simple substance substrate such as the metallic plate or the ceramics plate, the laminated substrate made of the same materials or the laminated substrate including at least one of them. Such a laminated substrate can be manufactured by at least one of methods of a bonding method using an adhesive and a heat sealing method.

Further, when a polarization property is not required like a TFT substrate of a reflecting type liquid crystal display panel, a TFT/light emitting layer substrate of an organic electroluminescence display panel, etc., a substrate can be also used in which a coefficient of linear expansion in a low temperature area, for example, from room temperature to 100 to 120° C. is apparently reduced by a well-known biaxial stretching method upon manufacturing a polymer substrate. As materials for which the biaxial stretching method has been already put to practice, there may be exemplified polyethylene terephthalate and polyethylene naphthalate.

Before the third substrate is bonded to the protective layer, the protective layer may be removed in order to ensure a light transmission property. A method for removing the protective layer can be properly determined depending on the material of the protective layer and the like.

After that, the step (4) is carried out. In other words, the second substrate is separated or removed.

A method for separating or removing the second substrate can be properly selected depending on the material of the first adhesive layer or the second substrate and the like. The second substrate is preferably separated or removed by lowering the adhesive strength of the first adhesive layer in accordance with at least one of a heating process or an immersion process in chemical liquid.

Now, the present invention will be specifically described by way of embodiments.

Initially, a first embodiment will be described. FIG. 1 shows a manufacturing flow chart of a thin film device according to the first embodiment of the present invention.

Firstly, as shown in FIG. 1A, a protective layer (for instance, a molybdenum (Mo) thin film having the thickness of 0.1 μm to 1 μm) 102 was formed on a first substrate (for instance, a glass substrate having the thickness of 0.7 mm) 101 by a sputtering method, and then, a thin film device layer 103 was formed by a low temperature polysilicon top gate type TFT process as described in, for instance, p. 115 to 118 of Liquid Crystal Display Technology (written by Shoichi Matsumoto, published by Sangyo Tosho, 1996).

Figure 1B:
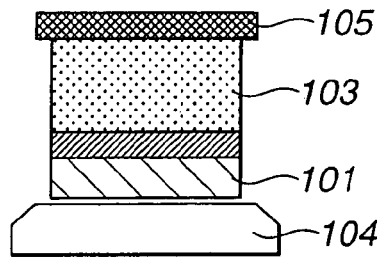

A TFT substrate manufactured as described above was cut to the size of 100 mm×100 mm. As shown in FIG. 1B, the first substrate 101 was heated by a hot plate 104 set to the temperature of 80° C. to 150° C. to form a first adhesive layer 105 on the thin film device layer 103. The first adhesive layer 105 was formed by applying a hot melt adhesive (for instance, ethylene-vinyl chloride-based adhesive having the thickness of 0.1 mm to 1 mm on the thin film device layer 103.

When a sheet-like hot melt adhesive having the thickness of about 0.05 mm to 1 mm was mounted on the heated thin film device layer 103, was obtained the same result as that when the hot melt adhesive was heated and melted and the melted adhesive was applied on the thin film device layer 103.

Figure 1C:
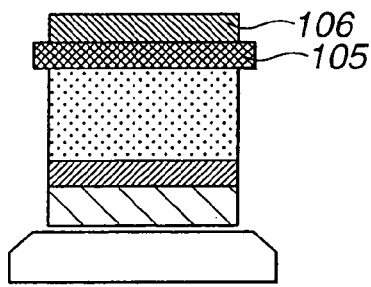

Then, as shown in FIG. 1C, a second substrate 106 made of, for instance, a molybdenum plate with the thickness of 1 mm was mounted on the first adhesive layer 105, and cooled to room temperature while pressing under the pressure of, for instance, 5×10$^4$ Pa so that the second substrate 106 is stuck to the first adhesive layer 105. In this case, when the second substrate (in this embodiment, the molybdenum plate) 106 was heated, the hot melt adhesive was applied thereto and the thin film device layer 103 side of the first substrate 101 was stuck thereto, the same result was obtained.

Figure 1D:
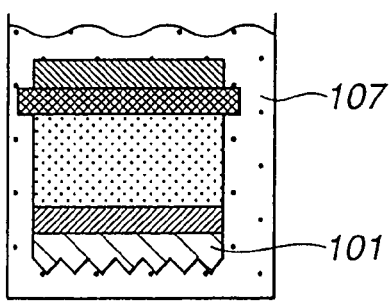
Figure 1E:
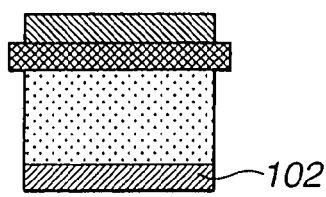

Then, as shown in FIG. 1D, the member thus obtained was immersed in hydrofluoric acid (HF) 107 having weight concentration of 50% to 60%, and was subjected to an etching process for 3.5 hours at room temperature to completely remove the first substrate (glass substrate) 101. As a result, as shown in FIG. 1E, the protective layer 102 was exposed. After the first substrate 101 was removed, a product obtained by the etching process which may remain on the surface of the protective layer (molybdenum thin film) 102 could be removed by washing with water. While the concentration of hydrofluoric acid may be lower than the above-described concentration, etching time and liquid temperature are adjusted as required. Further, a mechanism for agitating and circulating liquid during the etching process and maintaining a prescribed HF concentration was effective in order to improve a uniformity in plane of etching.

Figure 1F:
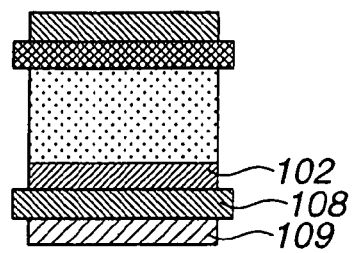

Then, as shown in FIG. 1F, a third substrate 109 made of polyimide with the thickness of 0.25 mm was stuck to the protective layer 102 by a second adhesive layer 108 composed of an epoxy resin-based adhesive (for instance, trade name of Araldite, bond-quick series, etc.).

Figure 1G:
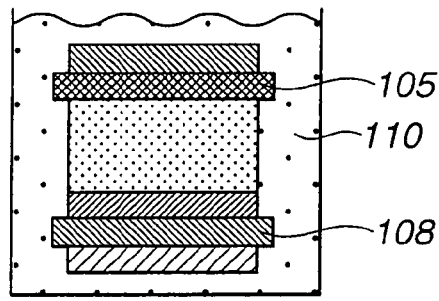

After the second adhesive layer 108 was adequately hardened, the member thus obtained was immersed in acetone solution 110 for 3 hours at room temperature as shown in FIG. 1G. In such a manner, acetone infiltrated into the first adhesive layer 105 so that the adhesive strength was adequately lower than that of the second adhesive layer 108 composed of the epoxy resin-based adhesive.

When the adhesive strength of the first adhesive layer (here, the hot melt adhesive) 105 is lower than that of the second adhesive layer (here, the epoxy rein-based adhesive) 108, the second substrate (here, the molybdenum plate) 106 can be separated only by mechanically peeling without weakening the adhesive strength of the first adhesive layer 105 by immersing the member thus obtained in a chemical agent or applying heat or light thereto. This may be adapted to the following embodiments.

Figure 1H:
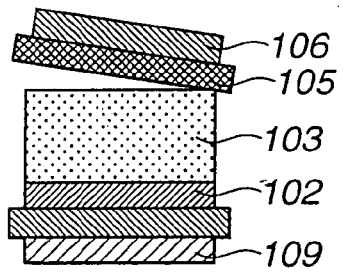

Finally, as shown in FIG. 1H, a slit was formed by, for instance, a cutter knife between the thin film device layer 103 and the hot melt adhesive layer of the first adhesive layer 105 so that the second substrate 106 and the first adhesive layer 105 were mechanically separated from the thin film device layer 103 by making use of the slit as a starting point.

Figure 1I:
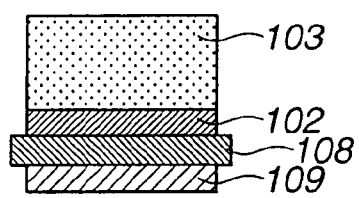

In accordance with these processes, the thin film device layer 103 was transferred on the third substrate (polyimide substrate) 109. Thus, there was obtained a structure as shown in FIG. 1I that the thin film device layer 103 was bonded to the third substrate 109 through the protective layer 102 by the second adhesive layer 108.

Figure 2A:
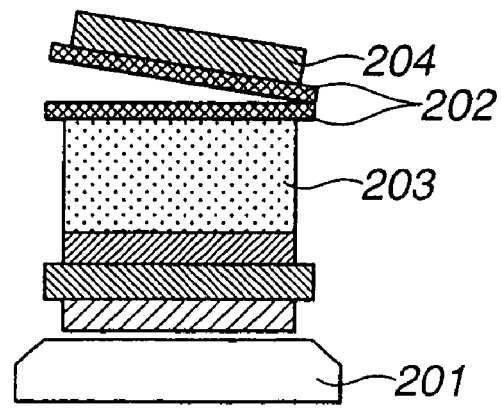
FIGS. 2A and 2B are sectional views explaining an example in which a molybdenum plate is separated from a device layer by heating in the first embodiment.
Figure 2B:
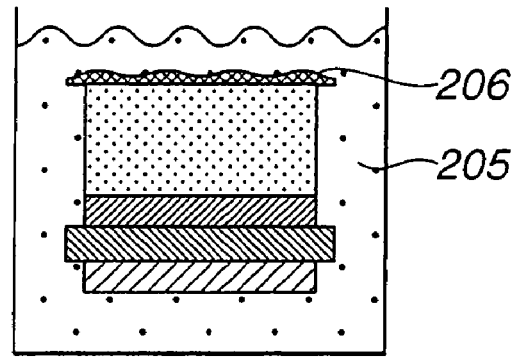

The member thus obtained was heated by a hot plate 201 set to temperature of 80° C. without immersing the member in the acetone solution as shown in FIG. 2A to lower the adhesive strength of a first adhesive layer 202 composed of the hot melt adhesive and mechanically peel off the first adhesive layer 202 while the first adhesive layer 202 was allowed to remain on both the sides of a thin film device layer 203 and a second substrate (molybdenum substrate) 204. After that, the member thus obtained was immersed in aceton solution 205 as shown in FIG. 2B to remove the residue 206 of the hot melt adhesive so that the structure the same as that shown in FIG. 1I could be also obtained.

Figure 3:
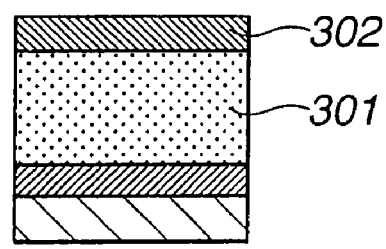
FIG. 3 is a sectional view for explaining that a device protective layer is formed before a hot melt adhesive is applied in the first embodiment.

Further, as shown in FIG. 3, even when a device protective layer 302 composed of an acrylic resin and having the thickness of 1 μm to 20 μm was formed before a hot melt adhesive was applied to a thin film device layer 301, the processes shown in the above-described FIGS. 1A to 1I, 2A and 2B could be likewise carried out. In this case, it may be advantageously anticipated that the diffusion of impurities to the thin film device layer from the hot melt adhesive is suppressed. However, since a transfer process according to the present invention was carried out at about 200° C. at the highest, the diffusion of impurities from the hot melt adhesive did not seriously deteriorate a TFT property.

Figure 4:
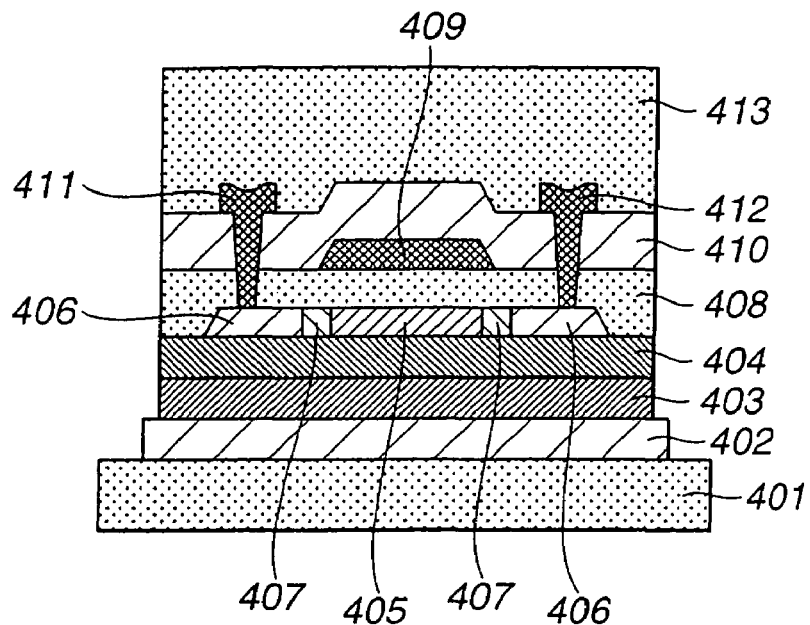
FIG. 4 is a schematic sectional view of an n channel type top gate TFT on a polyimide substrate manufactured in the first embodiment of the present invention.

FIG. 4 shows a sectional structure of an n channel type top gate TFT on the polyimide substrate manufactured according to the first embodiment of the present invention.

As shown in FIG. 4, on a polyimide substrate 401 having the thickness of 0.25 mm, a molybdenum layer 403 having the thickness of 500 nm and an electrical insulating layer 404 made of an $SiO_2$ layer with the thickness of 500 nm formed by a plasma CVD method or a laminated body of an $SiO_2$ layer and an $SiN_x$ layer are formed through an epoxy resin adhesive layer 402. A polysilicon layer 405 serving as a channel forming area is formed thereon and polysilicon layers 406 made of n⁺ type dope areas and polysilicon layers 407 made of n⁻ type dope areas are formed at both the sides thereof. As described above, an active area has an LDD (Lightly Doped Drain) structure for making a high ON-state current compatible with a low OFF-state current. The polysilicon layers 405, 406 and 407 were manufactured in such a manner that amorphous silicon layers with the thickness of 30 nm to 100 nm which were made to grow by the plasma CVD method were irradiated with an XeCl excimer laser pulse having the wavelength of 308 nm, molten and recrystallized.

A gate insulating film 408 composed of an SiO₂ layer formed by the plasma CVD method or a laminated body composed of an SiO₂ layer and an SiN$_x$ layer is formed so as to cover the polysilicon layers 405 to 407 therewith. A gate electrode 409 made of molybdenum is formed thereon. Further, a passivation film 410 composed of an SiO₂ layer formed by the plasma CVD method or a laminated body composed of an SiO₂ layer and an SiN$_x$ layer is formed so as to cover the gate electrode 409 therewith. A source electrode 411 and a drain electrode 412 made of aluminum and connected to the polysilicon layers 406 are formed. Then, on an uppermost layer, a passivation film 413 made of an acrylic resin with the thickness of 1 μm to 3 μm is formed.

Figure 5:
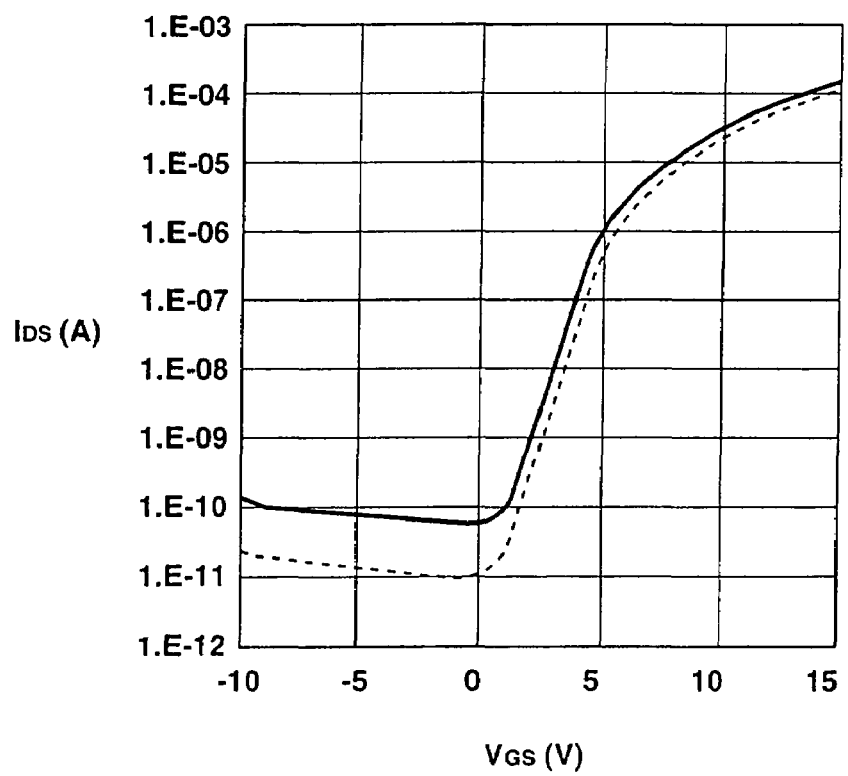
FIG. 5 is a characteristic view before and after the n channel type TFT having a sectional structure shown in FIG. 4 manufactured in the first embodiment of the present invention is transferred.

FIG. 5 shows a characteristic change before and after the transfer of the n channel type TFT having the sectional structure shown in FIG. 4 and manufactured according to the first embodiment of the present invention in which a channel length is, for instance, 10 μm, and a channel width is, for instance, 20 μm. As shown in FIG. 5, when a source-drain voltage $V_{DS}$ is 10 V and a source-gate voltage $V_{GS}$ is changed within a range of −10V to +15V, drain current $I_{DS}$ characteristics are expressed by ($I_{DS}$–$V_{GS}$ characteristics). Broken lines show characteristics before a transfer, that is, characteristics on a glass substrate and a solid line shows characteristics after a transfer. However, such a characteristic change as to cause a problem in a circuit operation was not seen.

Figure 6:
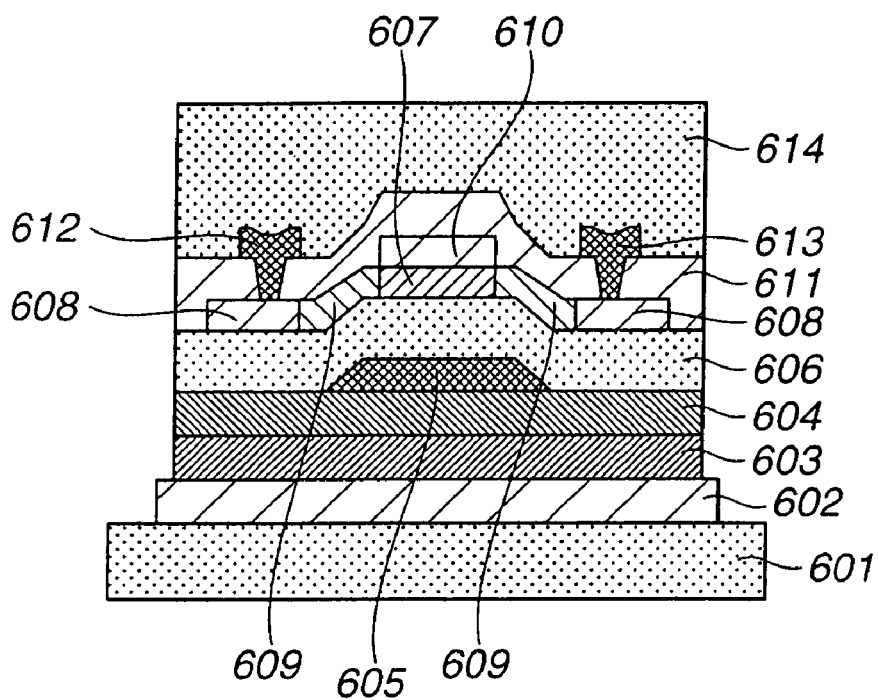
FIG. 6 is a sectional view showing an n channel type bottom gate TFT on a polyimide substrate manufactured in a second embodiment of the present invention.

Now, a second embodiment will be described below. FIG. 6 shows a sectional structure of an n channel type bottom gate TFT on a polyimide substrate manufactured according to the second embodiment of the present invention. A polyimide substrate having the thickness of 0.25 mm is designated by a reference numeral 601 shown in FIG. 6. An epoxy adhesive layer is designated by a reference numeral 602.

A construction shown in FIG. 6 is different from that of the first embodiment from the viewpoint that a molybdenum gate 605 is formed on an electric insulating layer 604 with the thickness of 500 nm composed of an SiO₂ layer formed by a plasma CVD method or a laminated body including an SiO₂ layer and an SiN$_x$ layer on a molybdenum layer (protective layer) 603 with the thickness of 500 nm. A gate insulating film 606 composed of an SiO₂ layer or a laminated body including an SiO₂ layer and an SiN$_x$ layer, and polysilicon layers 607, 608 and 609 are formed thereon. The polysilicon layer 607 serves as a channel forming area and is formed in the upper part of the molybdenum gate 605. The polysilicon layers 608 made of n⁺ type dope areas are formed through the polysilicon layers 609 made of n⁻ type dope areas at both the sides thereof. Further, on the polysilicon layer 607, a stopper SiO₂ layer 610 for protecting a channel upon implanting n type phosphorus ions is formed.

In the stopper SiO₂ layer 610, a self-alignment by an exposure from the back surface side of the substrate (lower part in FIG. 6) cannot be performed due to the presence of the molybdenum layer 603. Thus, a pattern was formed by an ordinary photolithography through an exposure from an upper part in FIG. 6.

Further, a passivation film 611 composed of an SiO₂ layer formed by the plasma CVD method or a laminated body including an SiO₂ layer and an SiN$_x$ layer is formed. A source electrode 612 and a drain electrode 613 made of aluminum respectively connected to the polysilicon layers 608 are formed on the passivation film 611. Then, a passivation film 614 made of an acrylic resin and having the thickness of 1 μm to 3 μm is formed on an uppermost layer.

Figure 7:
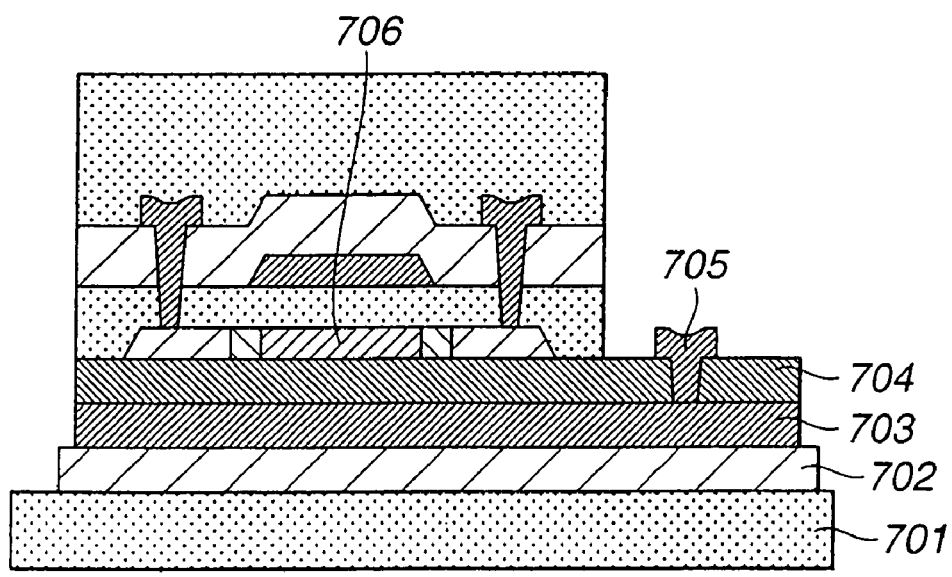
FIG. 7 is a sectional view showing an n channel type top gate TFT on a plastic substrate manufactured in a third embodiment of the present invention.

Now, a third embodiment will be described. FIG. 7 shows a sectional structure of an n channel type top gate TFT on a plastic substrate manufactured in accordance with the third embodiment of the present invention.

As shown in FIG. 7, on a polyimide substrate 701 having the thickness of 0.25 mm, are formed a molybdenum layer 703 having the thickness of 500 nm and an electric insulating layer 704 composed of an SiO₂ layer formed by the plasma CVD method or a laminated body including an SiO₂ layer and an SiN$_x$ layer through an epoxy resin adhesive layer 702. On the electric insulating layer 704, an aluminum terminal 705 connected to the molybdenum layer 703 is formed. Further, on the electric insulating layer 704, is formed a thin film transistor having such a structure including a polysilicon channel 706 as described in FIG. 4.

The third embodiment is different from the first embodiment from the viewpoint that a contact hole is formed and the aluminum terminal 705 is provided on the electric insulating layer 704. For instance, this terminal is connected to a ground potential so that the potential of the polysilicon channel 706 in the polyimide substrate 701 side can be fixed. As a result, the potential in the channel hardly received the influence of an electric field from peripheral wirings or devices, so that characteristics were stabilized irrespective of the patterns of arranged circuits. That is, a back channel effect was outstandingly effectively suppressed.

In a semiconductor device having a TFT element bonded onto a plastic substrate by an epoxy resin-based adhesive or the like as described above, a structure in which a conductive thin film capable of an electric field shield, a molybdenum thin film in this case, is formed between the plastic substrate and the TFT element is novel. This structure is an essential structure in putting to practical use a method for manufacturing a thin film device in which the TFT element is transferred to the plastic substrate from a glass substrate by a twice transferring method.

Now, a fourth embodiment will be described by referring to FIGS. 8A and 8B.

Figure 8A:
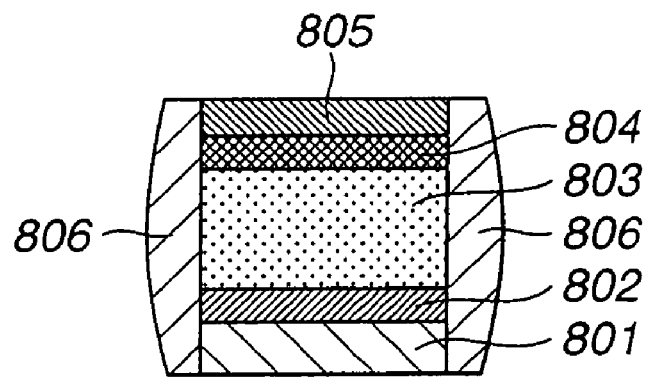
FIGS. 8A and 8B are sectional views for explaining a method for sealing an outer periphery when a glass substrate is etched in a fourth embodiment of the present invention.
Figure 8B:
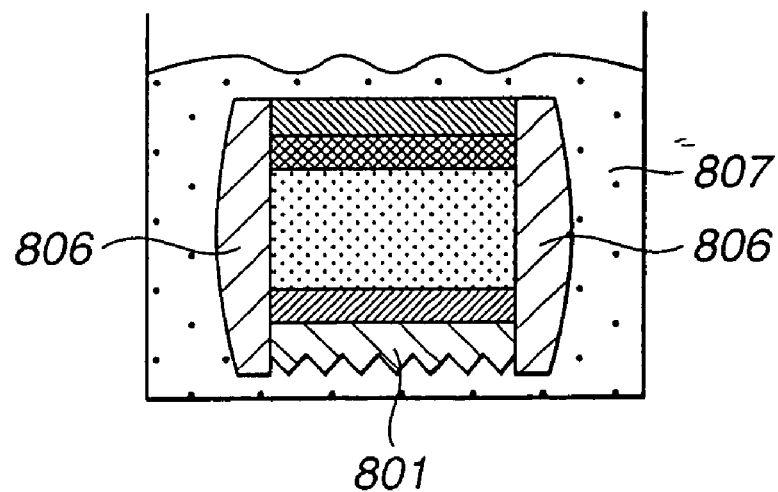

In the fourth embodiment as shown in FIG. 8A, a molybdenum layer 802, a device layer 803, a hot melt adhesive layer 804 and a molybdenum plate 805 are laminated on a glass substrate 801 and hydrofluoric acid resistant seals 806 are formed on the side surfaces of them.

The fourth embodiment is different from the first embodiment from the viewpoint that after the molybdenum plate 805 is bonded to the device layer 803, outer peripheral end parts are sealed by the hydrofluoric acid resistant seals 806 made of a resin having a hydrofluoric acid resistance such as a hot melt adhesive as shown in FIG. 8A, before the first substrate (glass substrate) shown in FIG. 1D of the first embodiment is etched. In such a structure, as shown in FIG. 8B, the entry of hydrofluoric acid 807 from end parts during the etching process of the glass substrate 801 could be effectively assuredly prevented by the hydrofluoric acid resistant seals 806.

Figure 9A:
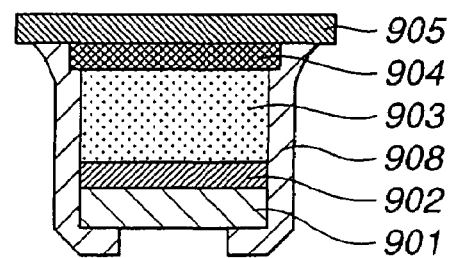
FIGS. 9A to 9D are sectional views for explaining a method for sealing an outer periphery in a fifth embodiment of the present invention different from the fourth embodiment.

Now, a fifth embodiment will be described by referring to FIGS. 9A to 9D. In the fifth embodiment, as shown in FIG. 9A, a molybdenum layer 902, a device layer 903, a hot melt adhesive layer 904 and a molybdenum plate 905 are sequentially laminated from a lower layer on a glass substrate 901. Seals 908 are formed on side surfaces.

Figure 9B:
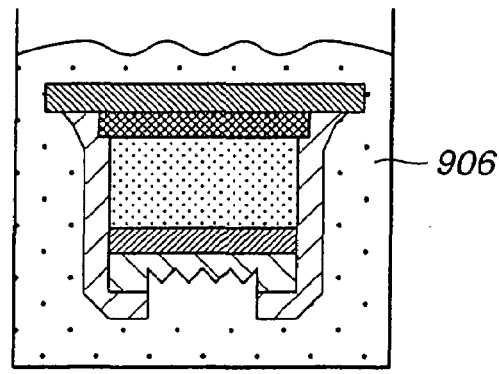
Figure 9C:
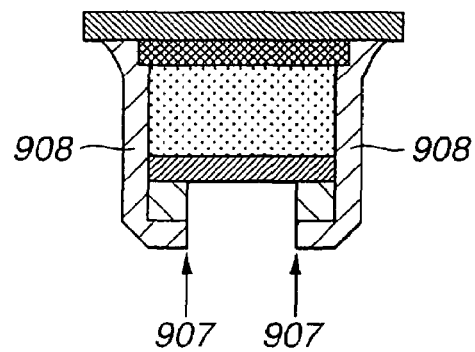
Figure 9D:
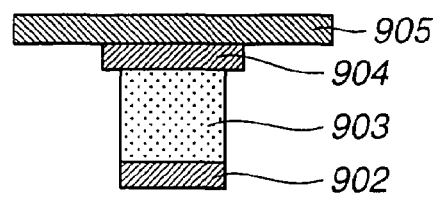

The fifth embodiment is different from the fourth embodiment from the viewpoint that the seals 908 in the outer peripheral end parts are formed from the lower surface of the glass substrate 901 to the lower surface of the molybdenum plate 905, as shown in FIG. 9A. Thus, as shown in FIG. 9B, the entry of hydrofluoric acid 906 during an etching process could be more assuredly prevented by the seals 908. In this case, as shown in FIG. 9C, after the glass substrate 901 is etched, the seal parts 908 formed in the outer peripheries are mechanically cut at positions shown by arrow marks 907 and a structure in which the molybdenum layer 902, the device layer 903, the hot melt adhesive layer 904 and the molybdenum plate 905 were sequentially laminated from the lower layer was obtained, as shown in FIG. 9D. Processes after a next process, that is, a process for sticking the laminated structure thus obtained to a polyimide substrate (see FIG. 1F) are the same as those of the first embodiment.

Now a sixth embodiment will be described by referring to FIGS. 10A to 10E.

Figure 10A:
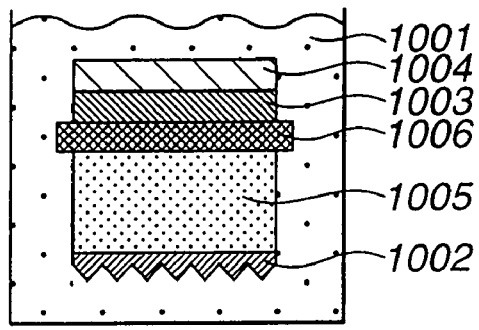
FIGS. 10A to 10E are sectional views showing the manufacturing processes of a light transmitting type active matrix type driving substrate according to a sixth embodiment of the present invention in order.

In the sixth embodiment, as shown in FIG. 10A, a laminated body obtained by sequentially laminating a molybdenum thin film 1002, a device layer 1005, a hot melt adhesive 1006, a molybdenum plate 1003 and a polyester film 1004 from a lower layer is immersed in etching solution 1001 for the molybdenum thin film.

The sixth embodiment is different from the first embodiment in a point of view that after a glass substrate is removed by an etching process by hydrofluoric acid, the laminated body is immersed in the etching solution 1001 composed of mixed acid including phosphoric acid ($H_3PO_4$) of 72%, nitric acid ($HNO_3$) of 3%, and acetic acid ($CH_3COOH$) of 10% (the rest is composed of water) to completely remove the molybdenum thin film 1002. Before the etching process, the polyester film 1004 was thermocompression-bonded to the surface of the molybdenum plate 1003 to protect it from the etching process. Dilute nitric acid may be likewise used as well as the mixed acid as the etching solution for the molybdenum thin film.

Figure 10D:
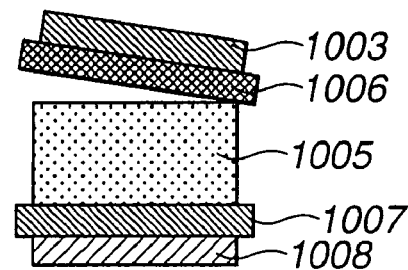
Figure 10B:
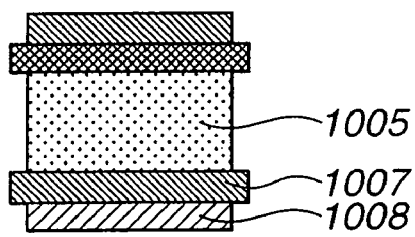
Figure 10E:
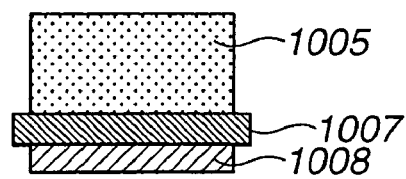

Then, after the laminated body was washed with water and dried, the polyester film 1004 was mechanically peeled off, then, a ultraviolet curing adhesive 1007 degassed in vacuum was applied to the device layer 1005 to have the thickness of 30 μm as shown in FIG. 10B. Further, the device layer 1005 was bonded to a transparent polycarbonate substrate 1008 with the thickness of 0.5 mm by applying the ultraviolet ray thereto.

Figure 10C:
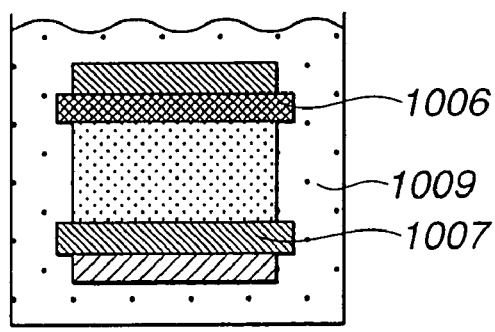

Subsequently, as shown in FIG. 10C, the laminated body thus obtained was immersed in isopropyl alcohol 1009 at room temperature for 20 hours. In such a manner, the isopropyl alcohol 1009 infiltrated into the hot melt adhesive 1006 so that the adhesive strength of the hot melt adhesive 1006 was adequately lower than that of the ultraviolet curing adhesive 1007.

Then, as shown in FIG. 10D, a slit is formed on an interface between the device layer 1005 and the hot melt adhesive layer 1006 by, for example, a cutter knife, and the molybdenum plate 1003 and the hot melt adhesive layer 1006 were mechanically separated from the device layer 1005 by making use of the slit as a starting point. In accordance with the above-described processes, the device layer 1005 was transferred to the transparent polycarbonate substrate 1008 through the ultraviolet curing adhesive 1007 so that a light transmitting active matrix type driving substrate was manufactured.

Figure 11:
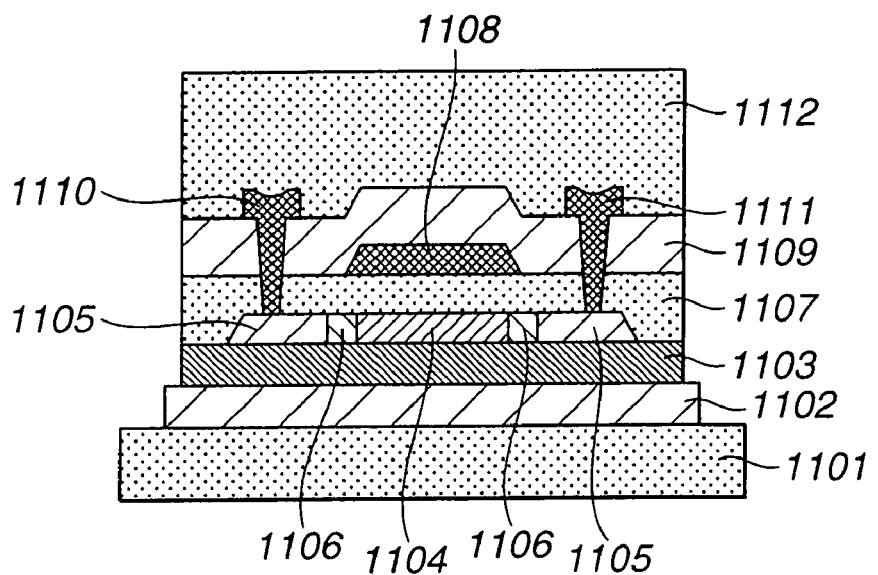
FIG. 11 is a schematic sectional view of an n channel type top gate TFT on a transparent polycarbonate substrate manufactured according to the sixth embodiment of the present invention.

FIG. 11 shows a sectional structure of an n channel type top gate TFT on a transparent polycarbonate substrate manufactured according to the sixth embodiment of the present invention.

As shown in FIG. 11, on a transparent polycarbonate substrate 1101 with the thickness of 0.5 mm, an electric insulating layer 1103 composed of an $SiO_2$ layer with the thickness of 500 nm formed by the plasma CVD method or a laminated body including an $SiO_2$ layer and an $SiN_x$ layer through an ultraviolet curing adhesive layer 1102 and polysilicon layers 1104, 1105, 1106 are formed thereon. That is, the polysilicon layer 1104 serves as a channel forming area and the polysilicon layers 1105 as n$^+$ type dope areas are formed at both the sides thereof through the polysilicon layers 1106 as n$^-$ type dope areas.

Further, a gate insulating film 1107 composed of an $SiO_2$ layer formed by the plasma CVD method or a laminated body including an $SiO_2$ layer and an $SiN_x$ layer is formed and a molybdenum gate 1108 is formed on the gate insulating film 1107 in the upper part of the polysilicon layer 1104. A passivation film 1109 composed of an $SiO_2$ layer formed by the plasma CVD method or a laminated body including an $SiO_2$ layer and an $SiN_x$ layer is formed so as to cover the molybdenum gate 1108 therewith. On the passivation film 1109, a source electrode 1110 and a drain electrode 1111 made of aluminum and respectively connected to the polysilicon layers 1105 are formed. On an uppermost layer, a passivation film 1112 made of an acrylic resin and having the thickness 1 μm to 3 μm is formed.

Figure 12:
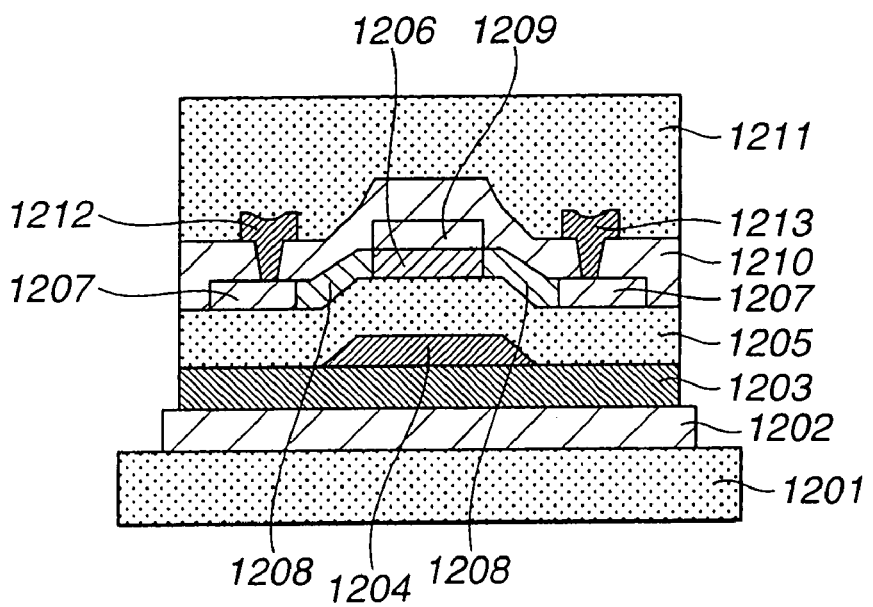
FIG. 12 is a sectional view showing an n channel type bottom gate TFT on a transparent polycarbonate substrate manufactured according to the sixth embodiment of the present invention.

FIG. 12 shows a sectional structure of an n channel type bottom gate TFT on a transparent polycarbonate substrate formed according to the sixth embodiment of the present invention.

As shown in FIG. 12, on a transparent polycarbonate substrate 1201 with the thickness of 0.5 mm, an ultraviolet curing adhesive layer 1202 and an electric insulating layer 1203 composed of an $SiO_2$ layer with the thickness of 500 nm formed by the plasma CVD method or a laminated body including an $SiO_2$ layer and an $SiN_x$ layer are sequentially formed. A molybdenum gate, 1204 is formed on the electric insulating layer 1203.

A gate insulating film 1205 composed of an $SiO_2$ layer or a laminated body including an $SiO_2$ layer and an $SiN_x$ layer is formed so as to cover the molybdenum gate 1204 therewith and polysilicon layers 1206, 1207 and 1208 are formed. The polysilicon layer 1206 serves as a channel forming area and the polysilicon layers 1207 as n$^+$ type dope areas are formed at both the sides thereof through the polysilicon layers 1208 as n$^-$ type dope areas. Further, on the polysilicon layer 1206, is formed a stopper $SiO_2$ layer 1209 for protecting a channel upon implanting n type ions.

Further, a passivation film 1210 composed of an $SiO_2$ layer formed by the plasma CVD method or a laminated body including an $SiO_2$ layer and an $SiN_x$ layer is formed. On the passivation film 1210, a source electrode 1212 and a drain electrode 1213 made of aluminum and respectively connected to the polysilicon layers 1207 are formed. On an uppermost layer, a passivation film 1211 made of an acrylic resin and having the thickness 1 μm to 3 μm is formed.

Now, a seventh embodiment will be described by referring to FIGS. 13A to 13F.

Figure 13A:
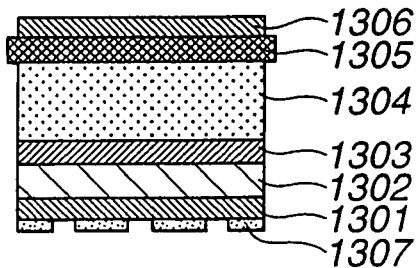
FIGS. 13A to 13F are sectional views showing the manufacturing processes of a thin film device in order in a seventh embodiment of the present invention having a process in which a glass substrate is separated and removed without completely etching the glass substrate by providing a separate layer on the glass substrate.
Figure 13B:
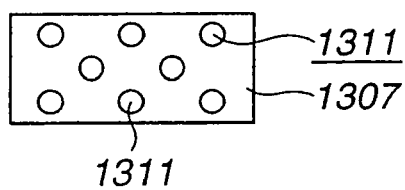

In the seventh embodiment, as shown in FIG. 13A, on a glass substrate 1301, a separate layer 1302, a molybdenum thin film 1303, a device layer 1304, a hot melt adhesive 1305 and a molybdenum plate 1306 are sequentially laminated from a lower layer. On the back surface of the glass substrate 1301, a photoresist 1307 is formed.

The seventh embodiment is different from the first embodiment from the viewpoint that the separate layer 1302 composed of $SiO_2$ which is formed by the plasma CVD method at the substrate temperature of 150° C. and whose etching rate after the completion of TFT processes is higher that of the glass substrate 1301 is formed to have the thickness of 600 nm.

After the separate layer 1302 was formed, the molybdenum thin film 1303 and the device layer 1304 were formed and the molybdenum plate 1306 was bonded thereto through the hot melt adhesive 1305 in the same manner as that of the first embodiment. After that, the photoresist 1307 with the thickness of 1 μm to 2 μm was applied to the back surface of the glass substrate 1301. On the photoresist 1307, holes 1311 having the diameter of 1.0 μm, whose arrangement in plane were schematically shown in FIG. 13B, were opened lengthwise and widthwise at pitches of 5 mm (at the rate of one for 5 mm square) by exposure and development processes.

Figure 13C:
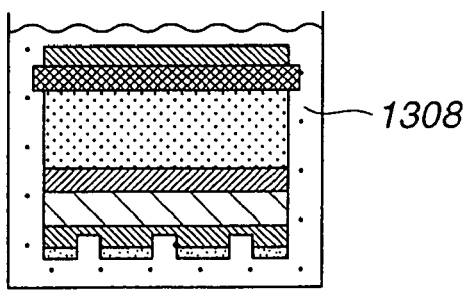
Figure 13D:
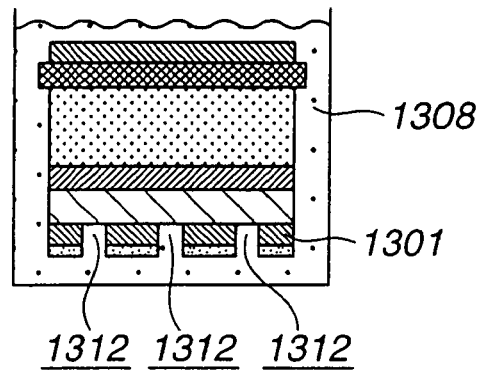

Then, as shown in FIG. 13C, an etching process was carried out by immersing the laminated body thus formed in hydrofluoric acid (HF) 1308 having weight concentration of 50% to 60% to form through holes 1312 passing through the glass substrate 1301 as shown in a sectional structure of FIG. 13D. The above-described etching process was carried out by immersing the substrate 1301 subjected to the above process in the hydrofluoric acid (HF) 1308 having the weight concentration of 50% to 60% at room temperature for 3.5 hours. The increase in diameter of the hole with the progress of the etching process was omitted in the drawings.

Figure 13E:
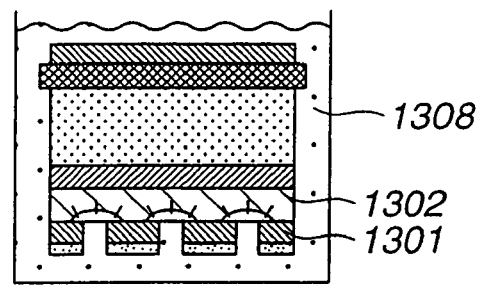
Figure 13F:
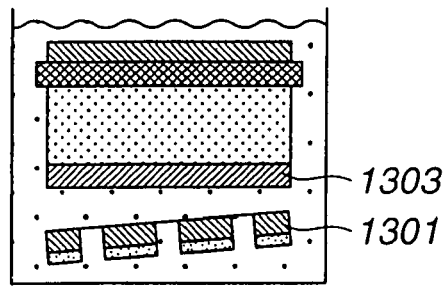

Then, FIG. 13E shows a state after the hydrofluoric acid 1308 reaches the separate layer 1302 composed of $SiO_2$. In this case, since the substrate temperature was low such as 150° C. and the structure was rough, etching speed increases 10 times as high as before and the hydrofluoric acid 1308 penetrated into an interface between the separate layer 1302 and the glass substrate 1301 to advance the etching process, so that the separate layer 1302 was completely removed after one hour. Consequently, as shown in FIG. 13F, the glass substrate 1301 was separated from the molybdenum thin film 1303. A merit of this embodiment resides in a point that since the amount of etching of the glass substrate 1301 is extremely lower than that of the first embodiment, the consumption of the hydrofluoric acid 1308 is low and the amount of waste liquid generated in the etching process is also extremely low.

Now, an eighth embodiment will be described by referring to FIGS. 14A to 14F.

Figure 14A:
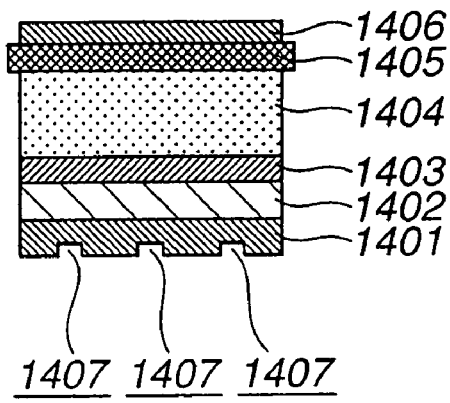
FIGS. 14A to 14F are plan views and sectional views showing the manufacturing processes of a thin film device in order in an eighth embodiment of the present invention including a process in which a glass substrate is separated and removed without completely etching the glass substrate by providing a separate layer on the glass substrate.
Figure 14D:
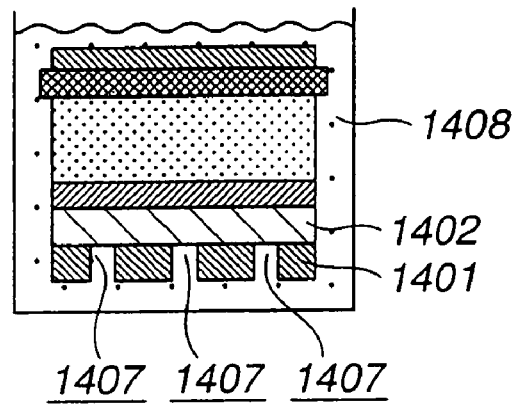
Figure 14B:
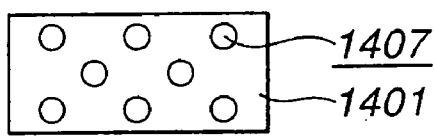

In the eighth embodiment, as shown in a sectional view of FIG. 14A and a plan view of FIG. 14B, on a glass substrate 1401, a separate layer 1402, a molybdenum thin film 1403, a device layer 1404, a hot melt adhesive 1405 and a molybdenum plate 1406 are sequentially laminated from a lower layer. On the back surface of the glass substrate 1401, counter bores 1407 are formed.

Figure 14E:
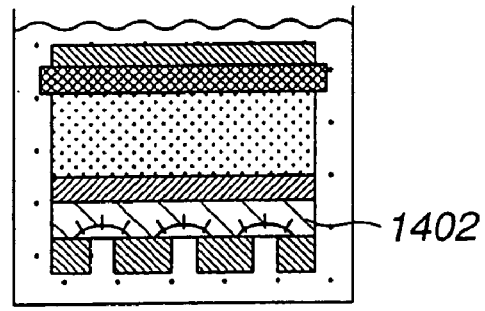
Figure 14C:
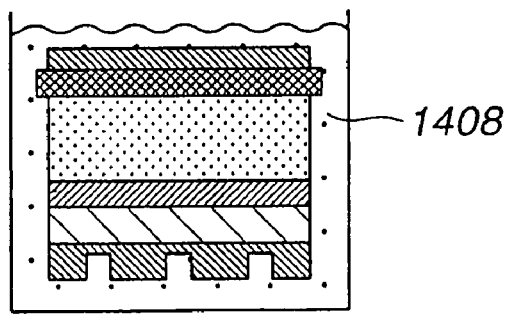

The eighth embodiment is different from the seventh embodiment from the viewpoint that the counter bores 1407 are formed on the back surface of the glass substrate 1401 having the thickness of 0.7 mm. The counter bores 1407 are opened with the depth of 0.4 mm at pitches of 5 mm by using, for example, a diamond drill and the laminated body thus formed is immersed in hydrofluoric acid (HF) 1408 having weight concentration of 50% to 60% to etch the glass substrate for 1.5 hours at room temperature, as shown in FIG. 14C.

Figure 14F:
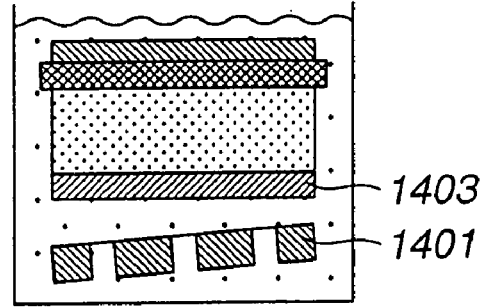

As shown in FIG. 14D, the etching of the glass substrate 1401 advanced from the counter bores 1407 and the hydrofluoric acid 1408 reached the separate layer 1402 after 2 hours. After that, as shown in FIG. 14E, the etching process of the separate layer 1402 began. Then, the separate layer 1402 was completely removed after one hour in the same manner as that of the fifth embodiment. As shown in FIG. 14F, the glass substrate 1401 was separated from the molybdenum thin film 1403.

An advantage of this embodiment resides in a point, equally to the seventh embodiment, that since the amount of etching of the glass substrate 1401 is extremely lower than that of the first embodiment, the consumption of the hydrofluoric acid 1408 is low and the amount of waste liquid generated in the etching process is also extremely low. In the eighth embodiment, since a machine work may be more inexpensive than the formation of a resist pattern on the back surface of the glass substrate 1401 in the seventh embodiment, an investment for a manufacturing device may be reduced. Further, since the depth of the glass substrate 1401 to be etched was the smaller for a drilling operation by the machine work, the etching time of the glass substrate 1401 was also advantageously decreased.

Now, a ninth embodiment will be described by referring to FIGS. 15A to 15J.

Figure 15A:
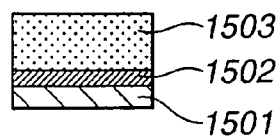
FIGS. 15A to 15J are sectional views showing in order the manufacturing processes of a thin film device according to a ninth embodiment including a process in which devices manufactured on separate substrates are piled on the same substrate.
Figure 15F:
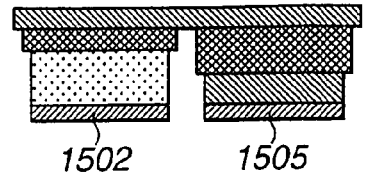
Figure 15B:
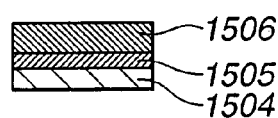

In the ninth embodiment of the present invention, as shown in FIG. 15A, on a glass substrate 1501 with the thickness of 0.7 mm, a molybdenum thin film 1502 with the thickness of 0.1 μm to 1 μm and a first device layer 1503 made of a low temperature polysilicon device were sequentially laminated in the same manner as that of the first embodiment. As shown in FIG. 15B, on a glass substrate 1504 with the thickness of 0.7 mm, a molybdenum thin film 1505 and a second device layer 1506 made of an amorphous silicon (a-Si) device were sequentially laminated in the same manner as that of the first embodiment.

Figure 15G:
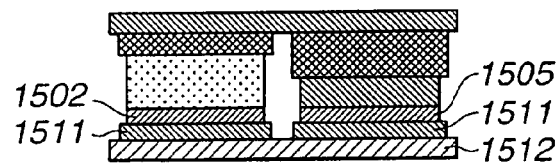
Figure 15C:
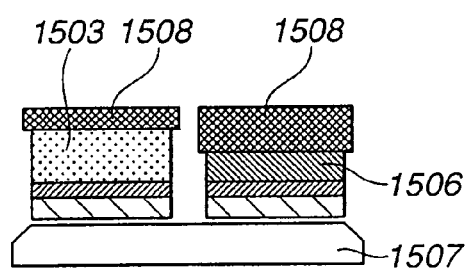

Then, as shown in FIG. 15C, these two devices were arranged, heated by a hot plate 1507 set to the temperature of 80 to 150° C. and a hot melt adhesive 1508 including ethylene-vinyl chloride copolymer as a component was applied to the first and second device layers 1503 and 1506 so as to have the thickness of 0.2 mm to 1 mm. In the drawing, although the two devices are separated from each other, they may be arranged so that end faces come into contact with each other without generating any problem.

Figure 15H:
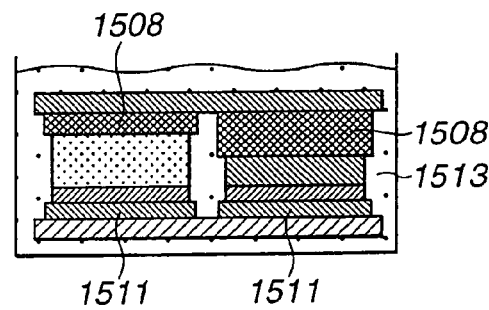
Figure 15D:
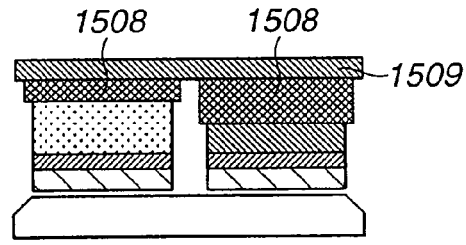

Then, as shown in FIG. 15D, a molybdenum plate 1509 with the thickness of 1 mm was mounted on the hot melt adhesive 1508, cooled to room temperature while the plate was pressed under 50 kPa, and stuck thereto. Then, as shown in FIG. 15E, the laminated body thus formed was immersed in hydrofluoric acid (HF) 1510 having weight concentration of 50% to 60% to etch the glass substrates 1501 and 1504 at room temperature for 3.5 hours and completely remove the glass substrates. As a result, as shown in FIG. 15F, the molybdenum thin films 1502 and 1505 were exposed.

As shown in FIG. 15G, an epoxy resin adhesive 1511 was applied to the surfaces of the molybdenum thin films 1502 and 1505 of the two devices and stuck to a polyimide substrate 1512 with the thickness of 0.25 mm.

After the epoxy resin adhesive 1511 was adequately hardened, as shown in FIG. 15H, the laminated body thus formed was immersed in acetone solution 1513 for 3 hours. In such a way, acetone infiltrated into the hot melt adhesive 1508 so that the adhesive strength thereof was smaller than that of the epoxy resin adhesive 1511.

Figure 15I:
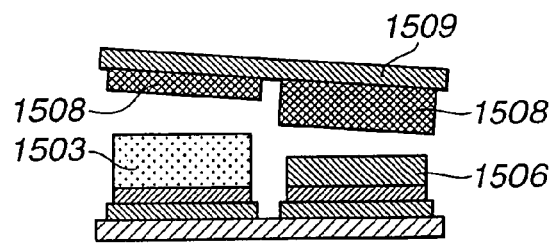
Figure 15E:
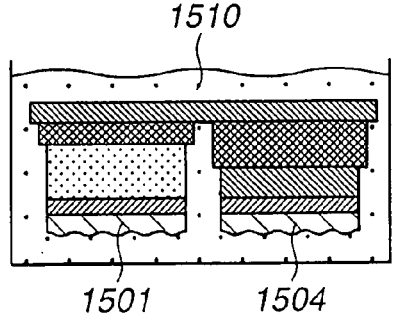
Figure 15J:
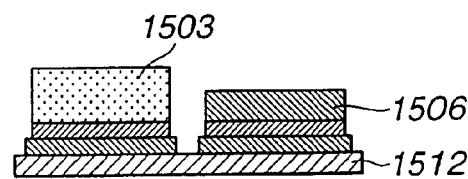

Finally, as shown in FIG. 15I, slits were formed on interfaces between the device layers 1503 and 1506 and the hot melt adhesive layers 1508 by, for instance, a cutter knife and the hot melt adhesive layers 1508 were mechanically separated from the device layers 1503 and 1506 by making use of the slits as starting points to separate the molybdenum plate 1509. In accordance with these processes, as shown in FIG. 15J, the two device layers 1503 and 1506 formed on the different substrates by the different processes were transferred to the same polyimide substrate 1512.

A plastic substrate compound TFT device in which a low temperature polysilicon top gate TFT and a reverse stagger type back channel etched amorphous silicon TFT are laminated on the same polyimide substrate manufactured according to the ninth embodiment of the present invention will be described by referring to a sectional structure view shown in FIG. 16.

Figure 16:
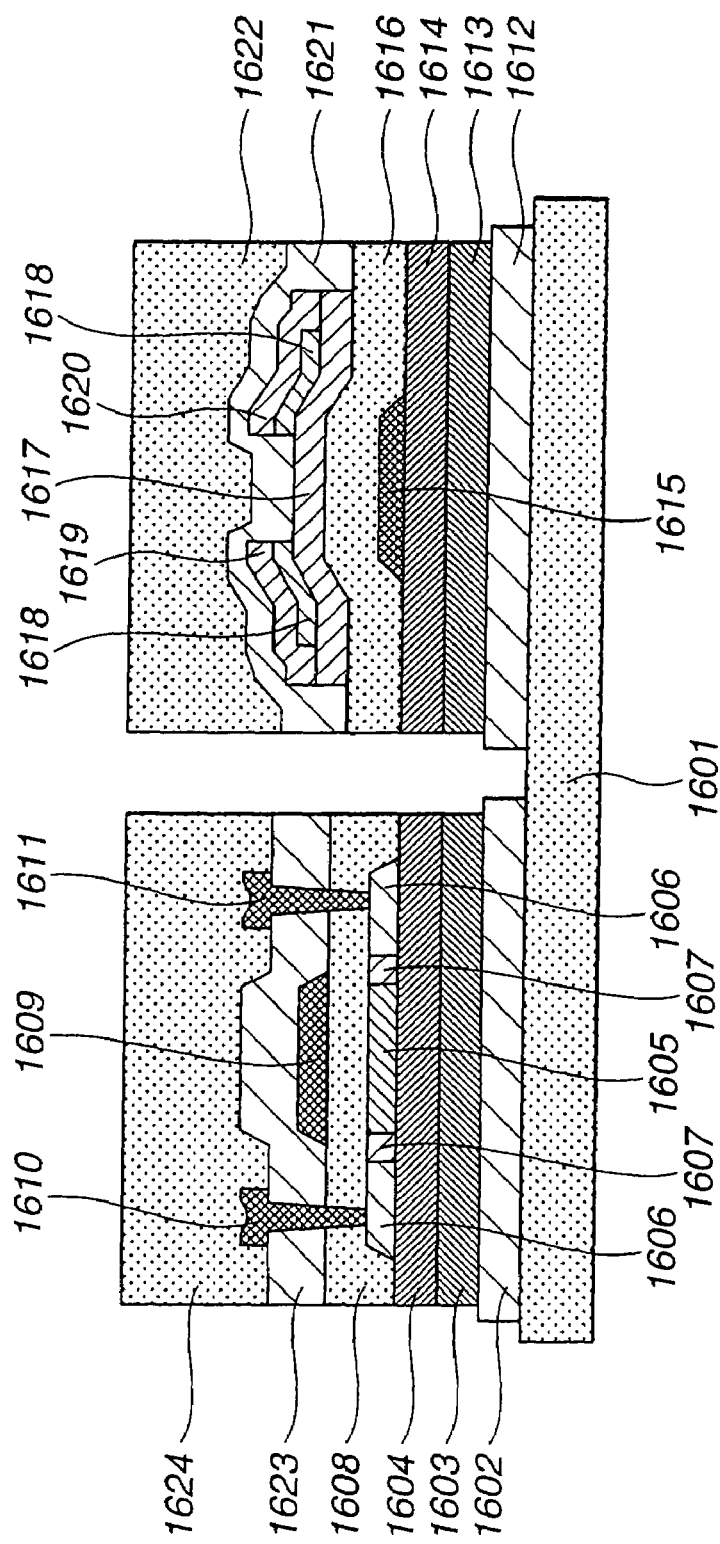
FIG. 16 is a sectional view showing a plastic substrate compounded device of a low temperature polysilicon TFT and an amorphous silicon TFT manufactured according to the ninth embodiment of the present invention.

As shown in FIG. 16, on a polyimide substrate 1601, molybdenum layers 1603 and 1613 and electric insulating layers 1604 and 1614 are sequentially formed from lower layers through epoxy resin adhesive layers 1602 and 1612.

On the electric insulating layer 1604, a polysilicon layer 1605 serving as a channel forming area is formed and polysilicon layers 1606 as n$^+$ type dope areas are formed at both the sides thereof through polysilicon layers 1607 as n$^-$ type dope areas. A gate insulating film 1608 composed of an SiO$_2$ layer formed by the plasma CVD method or a laminated body including an SiO$_2$ layer and an SiN$_x$ layer so as to cover the polysilicon layers 1605 to 1607 therewith is formed. A molybdenum gate 1609 is formed on the gate insulating film 1608 in the upper part of the polysilicon layer 1605.

A passivation film 1623 composed of an SiO$_2$ layer formed by the plasma CVD method or a laminated body including an SiO$_2$ layer and an SiN$_x$ layer is formed so as to cover the molybdenum gate 1609 therewith. On the passivation film 1623, a source electrode 1610 and a drain electrode 1611 made of aluminum and respectively connected to the polysilicon layers 1606 are formed. On an uppermost layer, a passivation film 1624 made of an acrylic resin and having the thickness of 1 μm to 3 μm is formed.

On the electric insulating layer 1614, a gate electrode 1615 is formed and a gate SiO$_2$ film 1616 is formed so as to cover the gate electrode 1615 therewith. Further, on the gate SiO$_2$ film 1616, an a-Si film 1617 is formed. On the a-Si film 1617, n$^+$ type a-Si films 1618 and 1618 are formed at both sides above the gate electrode 1615 and a drain electrode 1619 and a source electrode 1620 connected to the n$^+$ type a-Si films 1618 and 1618 are formed. A passivation film 1621 and a resin passivation film 1622 are laminated so as to cover them therewith.

In FIG. 16, the left half part in the drawing shows the low temperature polysilicon top gate TFT whose sectional structure is the same as that of the first embodiment of the present invention shown in FIG. 4. The right half part in the drawing shows the amorphous silicon TFT. In the amorphous silicon TFT, on the glass substrate, the molybdenum layer 1613 and the electric insulating layer 1614 composed of an SiO$_2$ layer with the thickness of 500 nm or a laminated body including an SiO$_2$ layer and an SiN$_x$ layer are formed. Then, in accordance with processes described in, for example, P. 34 to 36 of A Manual for Liquid Crystal Display Engineering (written by Yasoji Suzuki, published by The Nikkan Kogyo Shimbun Ltd. 1998), the gate electrode 1615, the gate SiO$_2$ film 1616, the a-Si film 1617, the n$^+$ type a-Si films 1618, the drain electrode 1619, the source electrode 1620, the passivation film 1621 and the acrylic resin passivation layer 1622 are formed. Then, they are bonded to the polyimide substrate 1601 through the epoxy resin adhesive layer 1612 by the same transfer processes as those of the first embodiment to obtain the structure shown in FIG. 16.

After the above transfer processes, on a part between a low temperature polysilicon TFT area and an amorphous silicon TFT area, a contact hole was formed on the well-known passivation film and wirings made of low resistant materials such as aluminum, aluminum-silicon alloys, etc. were arranged as required.

Figure 17:
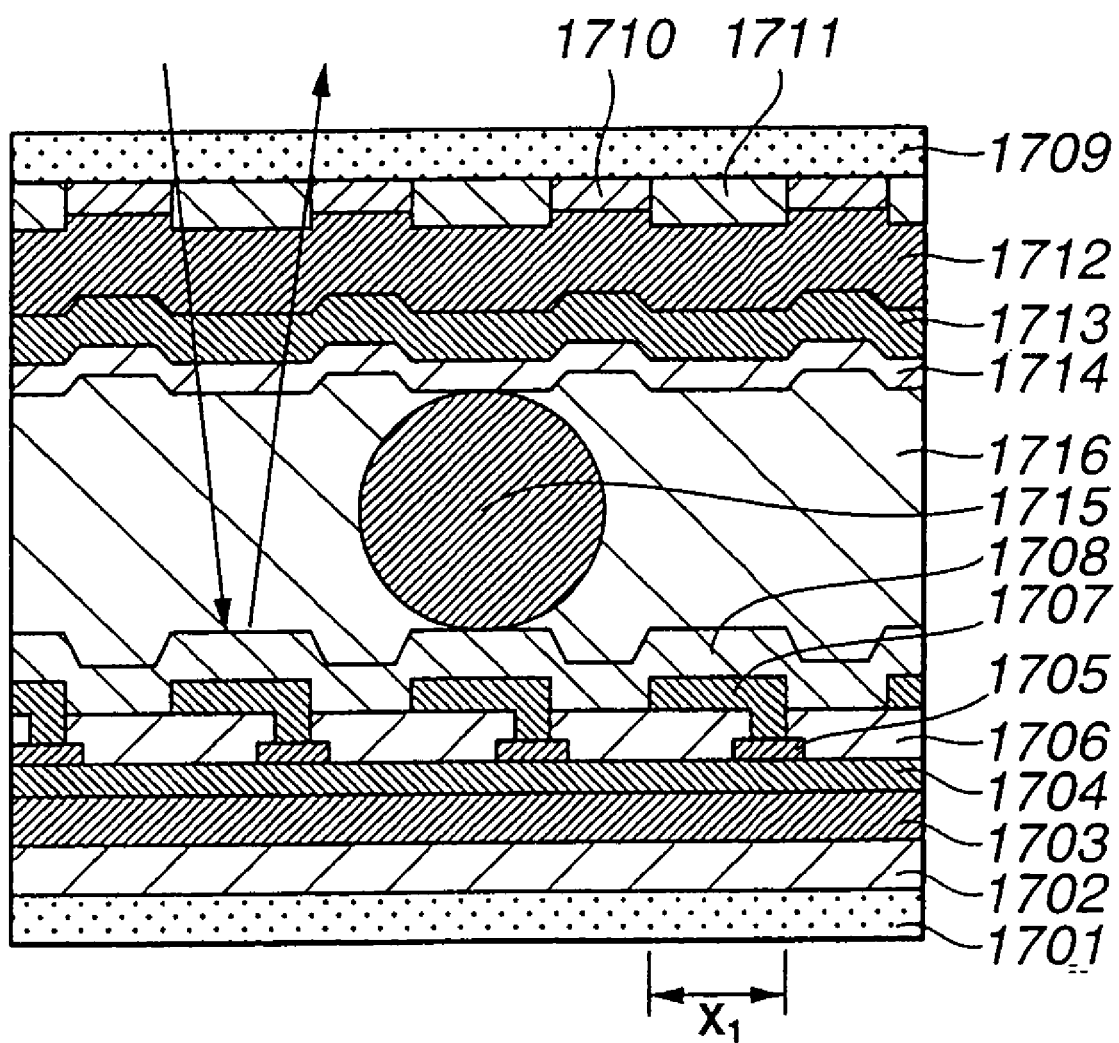
FIG. 17 is a sectional view showing a display part (pixel part) of a plastic substrate reflecting type liquid crystal display panel according to a tenth embodiment of the present invention.

Now, a tenth embodiment will be described by referring to FIG. 17. FIG. 17 shows a sectional structure of a display part (pixel part) of a plastic substrate reflecting type liquid crystal display panel according to the tenth embodiment of the present invention.

In the display part according to the present invention, firstly was manufactured in accordance with the first embodiment of the present invention, a TFT substrate having a structure that, on a laminated polyimide substrate 1701 with the thickness of 0.5 mm, a molybdenum layer 1703 with the thickness of 500 nm through an epoxy resin adhesive layer 1702, an electric insulating layer 1704 composed of an SiO$_2$ layer with the thickness of 500 nm or a laminated body including an SiO$_2$ layer and an SiN$_x$ layer, low temperature polysilicon top gates TFT 1705, a light scattered layer 1706 composed of a resin layer having irregularities of 1 μm to 2 μm, pixel electrodes 1707 composed of a silver thin film with the thickness of 100 nm to 300 nm and a polyimide orientation film 1708 with the thickness of 50 nm to 150 nm are sequentially laminated from a lower layer.

Before a transfer process, the polyimide orientation film 1708 was previously applied in accordance with a screen printing method and sintered, and further, a specific orientation was given to the polyimide orientation film 1708 by a well-known rubbing process in a liquid crystal panel manufacturing process. The orientation film was sintered and rubbed before the transfer process, so that the same processes as those of an existing glass substrate LCD was conveniently employed and the processes advantageously became easier than a method in which the sintering and rubbing processes were carried out after a transfer process was performed on a plastic substrate having no heat resistance nor rigidity.

Then, on a transparent poly carbonate substrate 1709 having the thickness of 0.4 mm, a black matrix 1710 for shielding light between pixels was formed by patterning a chromium thin film formed by a sputtering method in accordance with photolithography and wet etching processes. Further, was produced a counter substrate having a structure that a color filter pattern 1711 including colors of red, green and blue, an overcoat layer 1712 with the thickness of 2 μm, a common electrode 1713 composed of indium tin oxide (In$_2$O$_3$+SbO$_2$, referred it to as ITO, hereinafter) with the thickness of 100 nm to 200 nm and a polyimide orientation film 1714 with the thickness of 50 nm to 150 nm were sequentially laminated under processes having the substrate temperature of 150° C. or lower. The TFT substrate thus manufactured was superposed on the counter substrate through a spacer 1715 having a diameter of 3 μm to 5 μm and an outer peripheral part was sealed to obtain a structure in which a twisted nematic (TN) type liquid crystal 1716 is sealed.

In FIG. 17, X$_1$ designates the width of one pixel.

Figure 18:
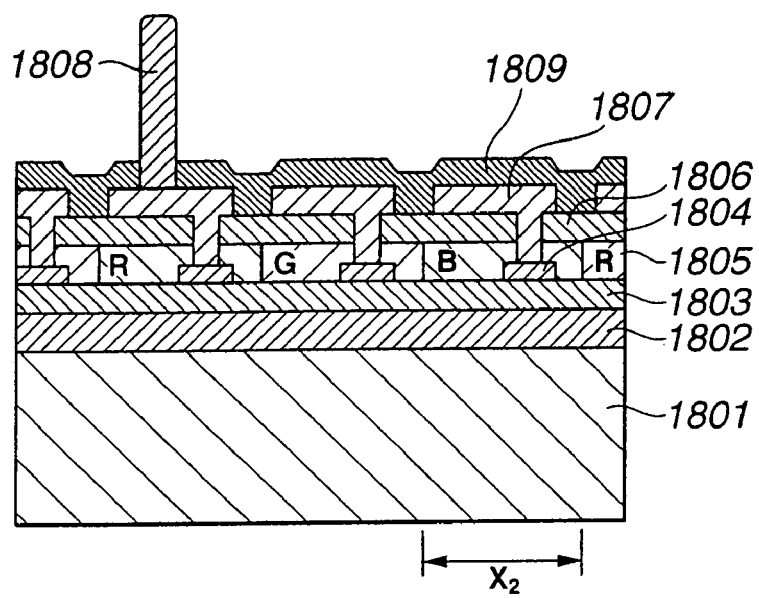
FIG. 18 is a sectional view showing a display part (pixel part) of a plastic substrate transmission type liquid crystal display panel according to an eleventh embodiment of the present invention.
Figure 19:
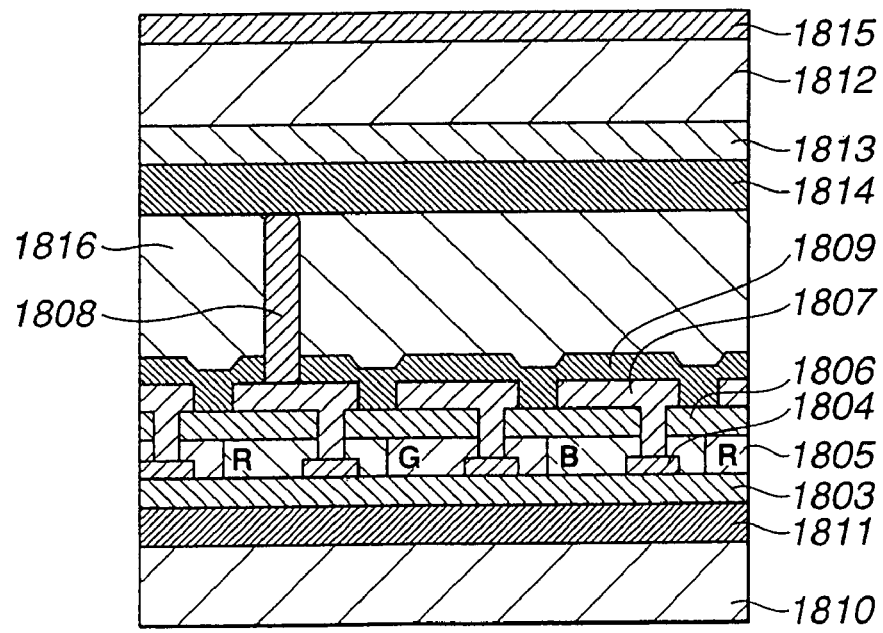
FIG. 19 is a sectional view showing the display part (pixel part) of the plastic substrate transmission type liquid crystal display panel according to an eleventh embodiment of the present invention.

Now, an eleventh embodiment will be described by referring to FIGS. 18 and 19. FIGS. 18 and 19 show the eleventh embodiment of the present invention and a process explaining view by way of a sectional structure of a display part (pixel pat) of a plastic substrate transmitting type liquid crystal display panel.

Firstly, as shown in FIG. 18, was manufactured a TFT substrate having a structure, afer a protective layer (for instance, a molybdenum (Mo) thin film having the thickness of 0.1 µm to 1 µm) 1802 was formed by a spattering method on a glass substrate 1801 with the thickness of 0.7 mm, that an electric insulating layer 1803 composed of an $SiO_2$ layer with the thickness of 500 nm or a laminated body including an $SiO_2$ layer and an $SiN_x$ layer, low temperature polysilicon bottom gates TFT 1804, a color filter pattern 1805 including color filters of red (R), green (G) and blue (B), a passivation film 1806 composed of an acrylic resin and having the thickness of 1 µm to 3 µm and pixel electrodes 1807 composed of the ITO, having the thickness of 100 nm to 200 nm and connected to the low temperature polysilicon bottom gates TFT 1804 were laminated sequentially from a lower layer.

After that, square pole shaped spacer patterns 1808 having one side of 10 µm and height of 3.5 µm were formed in non-light transmitting areas (areas having Mo patterns) on the pixel electrodes 1807 at the rate of one for 6 pixels by a lithography method. Then, a polyimide orientation film 1809 with the thickness of 50 nm to 150 nm was formed by applying it by a screen printing method and sintering at 200° C. for 2 hours. In FIG. 18, $X_2$ designates the width of one pixel.

Subsequently, a specific orientation was given to the polyimide orientation film 1809 by the well-known rubbing process in the liquid crystal panel manufacturing process, and then, the TFT substrate was transferred to a transparent polyether sulfone (PES) substrate 1810 having the thickness of 0.2 mm through an ultraviolet curing adhesive 1811 degassed in vacuum by the transfer method described in the sixth embodiment of the present invention, as shown in FIG. 19.

Then, was produced a counter substrate having a structure that, on a transparent PES substrate 1812 with the thickness of 0.2 mm, a common electrode 1813 having the thickness of 100 nm and made of the ITO and a polyimide orientation film 1814 with the thickness of 50 nm to 150 nm were sequentially laminated under processes whose substrate temperature is 150° C. or lower. As the PES substrate 1812, was used a substrate having a multi-layer structure including an organic layer composed of an acrylic resin and an inorganic layer composed of $SiN_x$, $SiO_2$, etc. and having a barrier layer 1815 relative to steam.

The TFT substrate and the counter substrate thus manufactured were superposed one upon another and an outer peripheral part was sealed to have a structure in which a twisted nematic (TN) type liquid crystal 1816 was sealed.

The eleventh embodiment is firstly different from the sixth embodiment from the viewpoint that the color filter layer 1805 ordinarily formed in the counter substrate side is formed in the TFT substrate side. Thus, the superposed margin of the counter substrate and the TFT substrate is advantageously increased. This constitutes a large merit when a high definition color LCD panel is manufactured from the plastic substrate, because the expansion and contraction of the plastic substrate may not be uniform in the substrates or between the substrates when the plastic substrates are superposed mutually, and the absolute values thereof are generally larger than those of the glass substrates.

The eleventh embodiment is secondly different from the sixth embodiment in a point of view that the polyimide orientation film is sintered and rubbed before the transfer process. Accordingly, the same processes for the existing glass substrate may be employed and the processes are carried out more easily than the method in which the sintering and rubbing processes are carried out after the transfer process is performed on the plastic substrate having no heat resistance nor rigidity.

The eleventh embodiment is thirdly different from the sixth embodiment that the spacer pattern layers 1808 are formed on the uppermost layer of the TFT substrate. Accordingly, a spacer density can be more increased without a risk of the aggregation of spacers than a conventional scattering system, so that a plastic cell in which the rigidity of the substrate is lower than that of the glass substrate is advantageous. That is, can be eliminated a failure that the part having no spacer is loosened to allow the pixel electrodes 1807 to come into electric contact with the counter electrode 1813. Or when the spacers are formed with high density in the vicinity of a liquid crystal injection port, can be prevented a failure in a liquid crystal injection process that a liquid crystal cannot be injected, since the liquid crystal port undergoes atmospheric pressure to close or a liquid crystal injection time is abnormally increased.

The thin film device obtained according to the manufacturing method as described above can be preferably used as a liquid crystal display panel or an active matrix type driving substrate of an organic electroluminescence display panel. For instance, when a liquid crystal cell is formed from the thin film device as the active matrix type driving substrate and the counter substrate having a transparent conductive film formed on a light transmitting type plastic substrate, a non-glass substrate liquid crystal display panel is obtained. In this case, when a color filter layer is provided on either the active matrix type driving substrate or the counter substrate, a non-glass substrate full color liquid crystal display panel is obtained. Further, when the organic electroluminescence layer is provided on the thin film device as the active matrix type driving substrate, a non-glass substrate organic electroluminescence display panel is obtained. In this case, on a glass substrate, a driving thin film device layer is firstly formed. Then, an organic electroluminescence layer is formed. Finally, a protective layer is formed. Then, a laminated body thus formed can be transferred to a non-glass.

Figure 20:
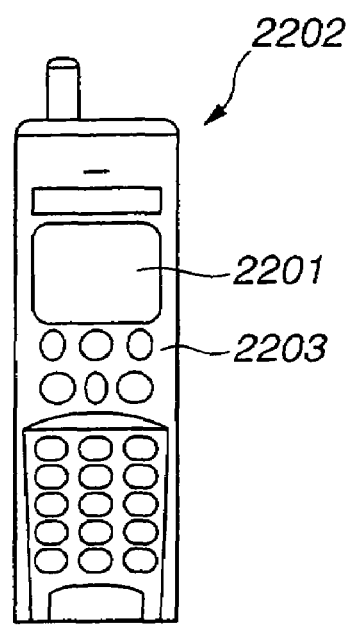
FIG. 20 is a perspective view showing a portable telephone including the thin film device obtained by the method for manufacturing the thin film device according to the present invention.
Figure 21:
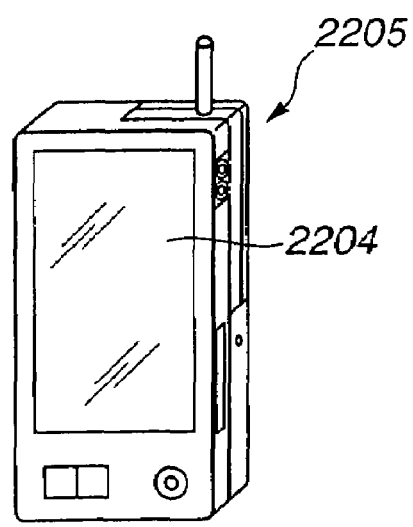
FIG. 21 is a perspective view similarly showing a portable information terminal.

These display panels are preferably attached to portable information terminals or portable telephones or the like. The display panels may be used for liquid crystal display devices of various kinds of devices. For instance, there is exemplified, as shown in FIG. 20, a portable telephone 2202 having a display part 2201 made of a liquid crystal panel. The liquid crystal panel is covered with a protective plate formed integrally with a front case 2203 to form the outermost surface of the display part 2201. Further, there is exemplified, as shown in FIG. 21, a portable information terminal 2205 having a display part 2204 provided with a touch panel in which the portable information terminal 2205 itself is operated and option devices such as a wireless telephone, a recording and reproducing function, a digital camera function, etc. mounted on the portable information terminal 2205 can be controlled by operating the touch panel of the display part 2204.

INDUSTRIAL APPLICABILITY

As described above, according to the present invention, since the thin film device layer is formed by using the first substrate and then, the first substrate is separated or removed therefrom and the third substrate is bonded thereto, the substrate temperature upon forming the thin film device layer does not receive a restriction relative to the heat resistance temperature of the third substrate, as compared with a case in which the thin film device layer is directly formed on the plastic substrate. Therefore, the plastic substrate whose heat resistant temperature is lower than that of the glass substrate can be employed for the third substrate. On the other hand, when the thin film device layer is formed, the substrate whose heat resistant temperature is high such as a quartz substrate, a silicon substrate, a gallium arsenide substrate, etc. can be employed, so that there is no fear that the performance or the reliability of the device is not lowered due to the fall of process temperature. Further, the device is not contaminated due to a process of degassing the plastic substrate in processes in vacuum when the TFT is produced.

Further, the device does not undergo influences of expansion, contraction and deformation due to the temperature hysteresis in the processes inseparable from the plastic substrate. Accordingly, there exists no danger of disconnection of wirings or cracks of the device layer. Further, since the production processes are the same as those for a glass substrate except a transfer part, a production line can be commonly utilized so that an investment efficiency is high.

According to the present invention, since the thin film devices manufactured by different processes can be laminated on the same non-glass substrate, a driving circuit in the peripheral part of a panel is manufactured by, for instance, a low temperature polysilicon TFT capable of forming a CMOS circuit excellent in its driving capability, a switching circuit part of a display part (pixel part) is manufactured by an inexpensive amorphous silicon device whose characteristics are easily made uniform throughout a large area, both the devices are laminated on the same non-glass substrate and wirings between the devices are separately arranged so that a low temperature polysilicon-amorphous silicon compound driving substrate can be manufactured more easily than by a low temperature polysilicon single process. In this case, an expensive micronizing process is used and limited to the driving circuit part of the peripheral part of the panel which is produced by the low temperature polysilicon process, so that a low cost can be achieved at the same time.

Further, since the third substrate is not used upon manufacturing the TFT, a request for the surface roughness is much lower than that for the first substrate. Therefore, the plastic substrate, the metallic substrate or the ceramic substrate can be used as well as the conventional glass substrate or a silicon wafer so that means for selecting when a display panel is designed are advantageously increased.

The invention claimed is:

1. A method for manufacturing a thin film device comprising the steps of:

forming a protective layer on a first substrate;
   forming a thin film device layer on said protective layer;
   forming a first adhesive layer on said thin film device layer;
   bonding a second substrate to said thin film device layer with said first adhesive layer;
   exposing at least a portion of said protective layer by separating or removing at least a portion of said first substrate using an effective process;
   bonding a third substrate to at least a portion of said exposed protective layer with a second adhesive layer; and
   separating or removing said second substrate,
   wherein
   a separate layer is provided between the first substrate and the protective layer and the chemical processing speed of said separate layer is higher than that of the first substrate, and
   the chemical process of the separate layer is carried out by allowing chemical agent to reach the separate layer through a through hole of the first substrate formed by a chemical process subsequent to a process for forming at least one of a hole mechanically opened on the first substrate or a hole opened by a chemical process from a resist opening part formed by a photolithography on a resist layer with which the first substrate is covered,
   the first substrate is made of glass, the second substrate is made of molybdenum and the third substrate is made of polyimide.

2. The method for manufacturing a thin film device according to claim 1, wherein said effective process is a mechanical process.

3. The method for manufacturing a thin film device according to claim 2, wherein the chemical process is a chemical etching process using chemical agents including hydrofluoric acid.

4. The method for manufacturing a thin film device according to claim 2, wherein the protective layer with which the first substrate side is covered functions as a stopper layer for the chemical process.

* * * * *